(12) United States Patent
Inoue et al.

(10) Patent No.: US 11,315,795 B2
(45) Date of Patent: Apr. 26, 2022

(54) SUBSTRATE PROCESSING METHOD AND SUBSTRATE PROCESSING APPARATUS

(71) Applicant: Tokyo Electron Limited, Tokyo (JP)

(72) Inventors: Masaki Inoue, Miyagi (JP); Cedric Thomas, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 2 days.

(21) Appl. No.: 17/223,213

(22) Filed: Apr. 6, 2021

(65) Prior Publication Data

US 2021/0313184 A1 Oct. 7, 2021

(30) Foreign Application Priority Data

Apr. 7, 2020 (JP) .............................. JP2020-069211

(51) Int. Cl.
*H01L 21/3065* (2006.01)
*H01J 37/32* (2006.01)
*H01L 21/67* (2006.01)

(52) U.S. Cl.
CPC ...... *H01L 21/3065* (2013.01); *H01J 37/3244* (2013.01); *H01L 21/67069* (2013.01); *H01J 2237/334* (2013.01)

(58) Field of Classification Search
None
See application file for complete search history.

(56) References Cited

FOREIGN PATENT DOCUMENTS

| JP | 2010-153702 A | 7/2010 |
| JP | 2013-110139 A | 6/2013 |

*Primary Examiner* — Roberts P Culbert
(74) *Attorney, Agent, or Firm* — Pearne & Gordon LLP

(57) ABSTRACT

A substrate processing method performed in a substrate processing apparatus includes providing a substrate which has a first film composed of silicon only and a second film including silicon; and etching the first film by plasma formed from a mixed gas including a halogen-containing gas and a silicon-containing gas but not including an oxygen-containing gas.

18 Claims, 3 Drawing Sheets

|  | EXPERIMENTAL EXAMPLE | COMPARATIVE EXAMPLE 1 | COMPARATIVE EXAMPLE 2 |
|---|---|---|---|
| Poly EA (Å) | 1676.3 | 193.1 | −20.7 |
| Ox EA (Å) | −43.6 | −9.9 | −33.8 |
| SiN EA (Å) | −20.9 | −0.6 | −8.6 |
| Poly/Ox | ∞ | ∞ | 0.6 |
| Poly/SiN | ∞ | ∞ | 2.4 |

SUBSTRATE PROCESSING METHOD AND SUBSTRATE PROCESSING APPARATUS

CROSS-REFERENCE TO RELATED APPLICATION

This application claims the benefit of Japanese Patent Application No. 2020-069211 filed on Apr. 7, 2020, the entire disclosure of which is incorporated herein by reference.

TECHNICAL FIELD

The various aspects and embodiments described herein pertain generally to a substrate processing method and a substrate processing apparatus.

BACKGROUND

There is known a process (for example, double patterning) of forming a fin-shaped silicon oxide film or silicon nitride film by etching a silicon film on a substrate. Further, there is also known a technique of forming a protective film by using a deposition gas to improve selectivity in the etching.

Patent Document 1: Japanese Patent Laid-open Publication No. 2013-110139

Patent Document 2: Japanese Patent Laid-open Publication No. 2010-153702

SUMMARY

In one exemplary embodiment, a substrate processing method performed in a substrate processing apparatus includes providing a substrate which has a first film composed of silicon only and a second film including silicon; and etching the first film by plasma formed from a mixed gas including a halogen-containing gas and a silicon-containing gas but not including an oxygen-containing gas.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
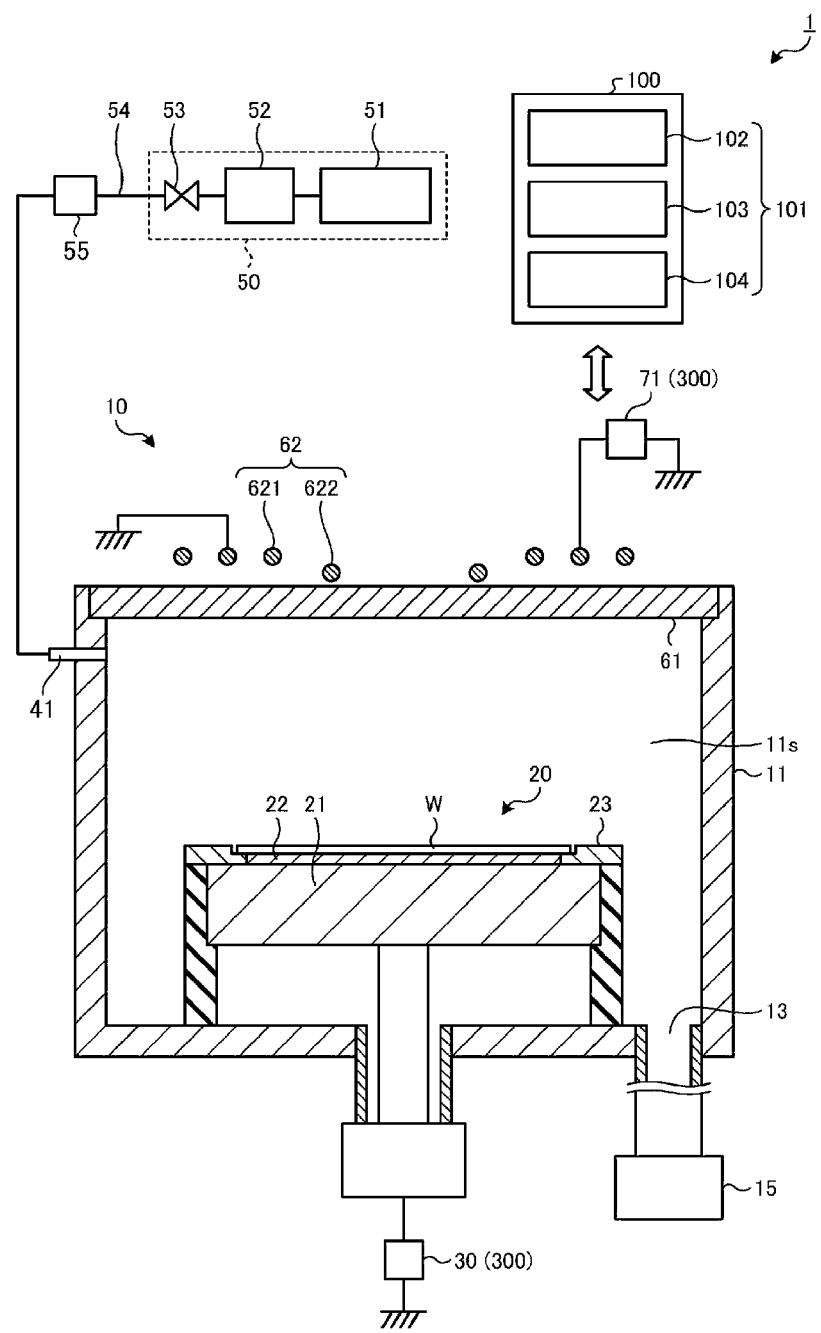
FIG. 1 is a diagram illustrating an example of a plasma processing system according to an exemplary embodiment of the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing method and a substrate processing apparatus according to the present disclosure will be described in detail with reference to the accompanying drawings. Further, it should be noted that the present disclosure is not limited by the following exemplary embodiments.

In a process of forming a fin-shaped silicon oxide film or silicon nitride film by etching a silicon film on a substrate, it is desirable to etch the silicon film under etching conditions having high selectivity. Further, when the fin-shaped film and a base film are made of different materials, it is desirable that the etching has high selectivity with respect to the base film as well as the fin-shaped film. By way of example, if the fin-shaped film is a silicon nitride film and the base film is a silicon oxide film, it is desirable that the etching has high selectivity with respect to the silicon oxide film as well as the silicon nitride film. Further, since it is required to remove the silicon film including a corner portion between the fin-shaped film and the base film, isotropic etching is required. For the reason, not only selectivity in a longitudinal direction but selectivity in a transversal direction is also required. That is, when over-etching is performed, a CD (Critical Dimension) loss of the fin-shaped film (for example, the silicon nitride film) needs to be suppressed.

Further, when a protective film is formed on a non-etching film (for example, the silicon nitride film) with a deposition gas in order to improve the selectivity, the protective film is also formed on an etching target film (for example, the silicon film). Accordingly, an etching rate of the etching target film may be reduced. That is, since an etching time increases, productivity is reduced. Further, when the fin-shaped film is formed, side etch of a side portion of the fin-shaped film may occur due to the increase of the etching time, raising a concern that a required shape may not be obtained. In this regard, it is required to etch the silicon at a high etching rate with high selectivity.

[Configuration of plasma processing system 1] FIG. 1 is a diagram illustrating an example of a plasma processing system 1 according to an exemplary embodiment. As depicted in FIG. 1, the plasma processing system 1 according to the exemplary embodiment includes a plasma processing apparatus 10 and a controller 100. The plasma processing apparatus 10 is an ICP (Inductively Coupled Plasma) type plasma processing apparatus, and includes a plasma processing chamber 11, a gas supply 50, a RF (Radio Frequency) power supply 300 and an exhaust system 15. Further, the plasma processing apparatus 10 also includes a substrate support 20, a gas inlet port 41 and an antenna 62. The substrate support 20 is disposed in a lower region of a plasma processing space 11s within the plasma processing chamber 11. The gas inlet port 41 is provided to a sidewall of the plasma processing chamber 11. The antenna 62 is disposed on or above the plasma processing chamber 11 (dielectric window 61).

The substrate support 20 is configured to support a substrate W in the plasma processing space 11s. In the exemplary embodiment, the substrate support 20 includes a lower electrode 21, an electrostatic chuck 22 and an edge ring 23. The electrostatic chuck 22 is provided on the lower electrode 21 and configured to support the substrate W on a top surface thereof. The lower electrode 21 serves as a bias electrode. The edge ring 23 is disposed on a top surface of a peripheral portion of the lower electrode 21, surrounding the substrate W. Further, though not shown, in the exemplary embodiment, the substrate support 20 may include a temperature control module configured to adjust at least one of the electrostatic chuck 22 and the substrate W to a target temperature. The temperature control module may include a heater, a path or a combination thereof. A temperature control fluid such as a coolant and a heat transfer gas flows in the path.

The gas inlet port 41 is configured to supply one or more processing gases from the gas supply 50 into the plasma processing space 11s. The gas supply 50 may include one or more gas sources 51, one or more flow rate controllers 52, one or more valves 53, a pipeline 54 and a flow splitter (gas flow rate distributor) 55. In the exemplary embodiment, the gas supply 50 is configured to supply the one or more processing gases into the gas inlet port 41 from the corresponding one or more gas sources 51 via the corresponding one or more low rate controllers 52, one or more valves 53, the pipeline 54 and the flow splitter 55. Each flow rate controller 52 may include, for example, a mass flow controller (MFC) or a pressure control type flow rate controller.

The RF power supply 300 is configured to supply a RF power, for example, one or more RF signals to the lower electrode 21 and the antenna 62. Accordingly, plasma is formed from the one or more processing gases supplied into the plasma processing space 11s. The RF power supply 300 is configured to serve as at least a part of a plasma forming unit configured to form the plasma from the one or more processing gases in the plasma processing chamber. In the exemplary embodiment, the RF power supply 300 includes a first RF power supply 71 and a second RF power supply 30.

The first RF power supply 71 includes a first RF power generator and a first matching circuit. In the exemplary embodiment, the first RF power supply 71 is configured to supply a first RF signal from the first RF generator to the antenna 62 via the first matching circuit. In the exemplary embodiment, the first RF signal is a source RF signal having a frequency ranging from 27 MHz to 100 MHz.

The second RF power supply 30 includes a second RF generator and a second matching circuit. In the exemplary embodiment, the second RF power supply 30 is configured to supply the second RF signal from the second RF generator to the lower electrode 21 via the second matching circuit. In the exemplary embodiment, the second RF signal is a RF bias signal having a frequency ranging from 400 kHz to 13.56 MHz.

The antenna 62 includes an external coil 621 and an internal coil 622 which are coaxially arranged. The internal coil 622 is disposed to surround a central axis of the plasma processing chamber 11. The external coil 621 is disposed around the internal coil 622, surrounding the internal coil 622. The external coil 621 serves as a primary coil connected to the first RF power supply 71. In the exemplary embodiment, the external coil 621 is a planar coil and formed to have a substantially circular spiral shape. The internal coil 622 serves as a secondary coil inductively coupled to the primary coil. That is, the internal coil 622 is not connected to the first RF power supply 71. In the exemplary embodiment, the internal coil 622 is a planar coil and formed to have a substantially circular ring shape. In the exemplary embodiment, the internal coil 622 is connected to a variable capacitor. By controlling a capacitance of the variable capacitor, a direction and a magnitude of a current flowing in the internal coil 622 are controlled. The external coil 621 and the internal coil 622 may be arranged at the same height or different heights. In the exemplary embodiment, the internal coil 622 is placed at a position lower than the external coil 621.

The exhaust system 15 may be connected to, for example, an exhaust port 13 provided at a bottom of the plasma processing chamber 11. The exhaust system 15 may include a pressure valve and a vacuum pump. The vacuum pump may include a turbo molecular pump, a roughing vacuum pump or a combination thereof.

In the exemplary embodiment, the controller 100 executes a computer-executable command for implementing various processes to be described in the present disclosure in the plasma processing apparatus 10. The controller 100 may be configured to control the individual components of the plasma processing apparatus 10 to perform the various processes to be described herein. In the exemplary embodiment, a part or the whole of the controller 100 may belong to the plasma processing apparatus 10. The controller 100 may include, by way of example, a computer 101. The computer 101 may include, for example, a processor (CPU: Central Processing Unit) 102, a storage 103, and a communication interface 104. The processor 102 may be configured to perform various control operations based on a program stored in the storage 103. The storage 103 may include a RAM (Random Access Memory), a ROM (Read Only Memory), a HDD (Hard Disk Drive), a SSD (Solid State Drive), or combinations thereof. The communication interface 104 may communicate with the plasma processing apparatus 10 through a communication line such as a LAN (Local Area Network).

[Structure of Substrate W]

Figure 2:
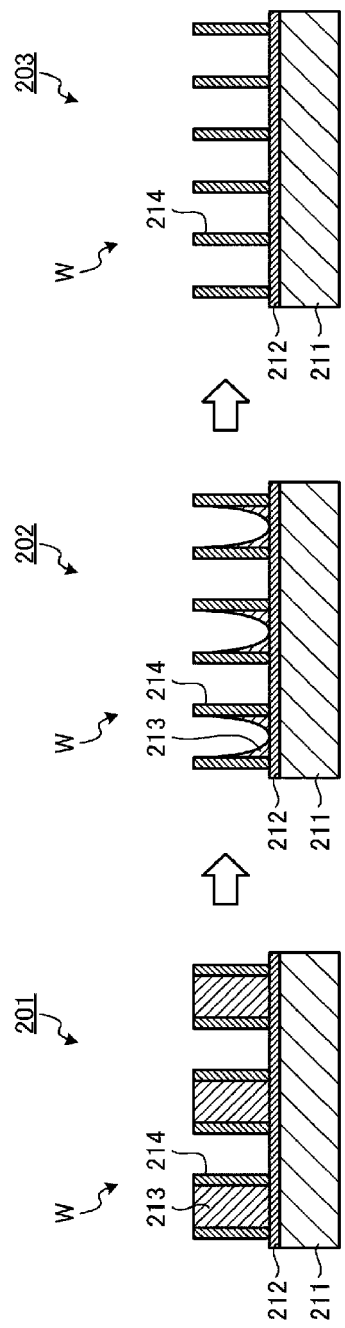
FIG. 2 is a diagram illustrating an example of a progress of etching of a substrate in the exemplary embodiment.

FIG. 2 is a diagram illustrating an example of a progress of etching of a substrate in the present exemplary embodiment. As illustrated in a state 201 of FIG. 2, the substrate W has, on a silicon base 211, a silicon oxide film 212, a silicon film 213 and a silicon nitride film 214. The silicon oxide film 212 is an etching stop layer (underlying film) formed on the silicon base 211. Formed on the silicon oxide film 212 are the silicon film 213 and the silicon nitride film 214 which are patterned. The silicon film 213 is an etching target film. The silicon nitride film 214 is formed to be in contact with a side surface of the silicon film 213. Upon the completion of the etching, the silicon nitride film 214 is left as a fin shape. That is, on the substrate W, top surfaces of the silicon film 213 and the silicon nitride film 214 are higher than a top surface of the silicon oxide film 212, and the silicon oxide film 212, the silicon film 213 and the silicon nitride film 214 are exposed to the plasma processing space 11s.

In the structure of the substrate W, when the silicon film 213 is a first film, the silicon nitride film 214 is a second film, and the silicon oxide film 212 is a third film, silicon (Si) such as polysilicon, amorphous silicon or single crystalline silicon may be used as the first film. Further, a silicon compound including one or more of oxygen, nitrogen and carbon may be used as the second film or the third film. By way of example, SiN, SiO$_2$, SiC, SiON, or SiOCH$_3$ may be used. The second film and the third film may be a film (for example, SiO$_2$) having the same composition, or may be films (for example, SiN and SiO$_2$) having different compositions.

Then, etching of the silicon film 213 is performed on the substrate W by plasma which is formed by a mixed gas (processing gas) including a halogen-containing gas and a silicon-containing gas but not including an oxygen-containing gas. Here, the halogen-containing gas is an etching gas, and the silicon-containing gas is an additive gas. The halogen-containing gas is a gas including a halogen which reacts with Si to be volatilized. By way of example, the halogen-containing gas is a gas including fluorine (F), chlorine (Cl), bromine (Br), or iodine (I) as the halogen. By way of non-limiting example, NF$_3$, SF$_6$, Cl$_2$, HCl, BCl$_3$, HBr, Br$_2$, HI or the like may be used. Further, a gas composed of a mixture of a plurality of these halogen-containing gases may be used.

The silicon-containing gas is a gas having silicon (Si) and one or more of halogen and hydrogen. By way of example, SiCl$_4$, SiF$_4$, SiH$_4$, SiH$_2$Cl$_2$ or Si$_2$H$_6$ may be utilized. Further, the mixed gas includes a rare gas as a dilution gas. The dilution gas is not particularly limited as long as it is capable of reducing a partial pressure of the additive gas. As the rare gas, helium (He), neon (Ne), argon (Ar), krypton (Kr) or xenon (Xe) may be used.

In a state 202, the etching progresses to some extent, so a portion of the silicon oxide film 212 covered with the silicon film 213 is exposed. In the state 202, however, the silicon film 213 is still left at a corner portion between the silicon oxide film 212 and the silicon nitride film 214. In the present exemplary embodiment, to removing this residual silicon film 213, over-etching is performed, so that the silicon film 213 is completely removed, as illustrated in a state 203. Further, since the silicon film 213 is completely removed, a protective film for the silicon film 213 need not be formed. Moreover, in the present exemplary embodiment, by performing isotropic etching without applying a bias, the silicon film 213 left at the corner portion is removed while etching of the silicon oxide film 212 as the underlying film is suppressed.

[Etching Method]

Figures 3, 4:
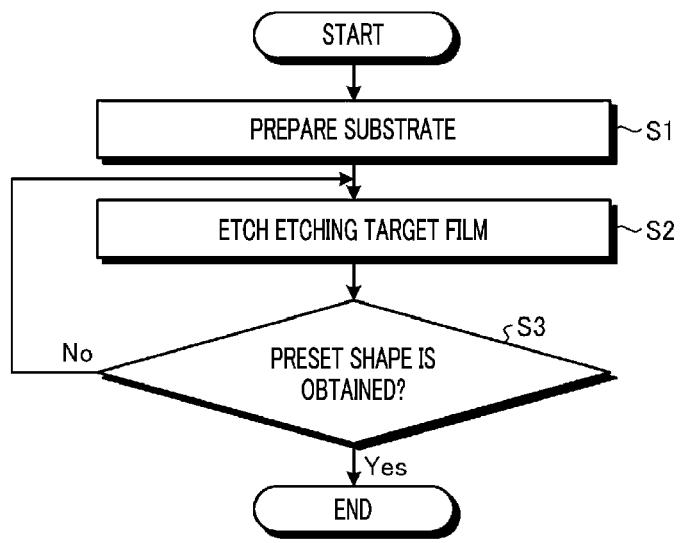
FIG. 3 is a flowchart illustrating an example of an etching processing according to the exemplary embodiment.
FIG. 4 is a diagram showing an example of experimental results.

Now, an etching method according to the present exemplary embodiment will be discussed. FIG. 3 is a flowchart illustrating an example of an etching processing according to the present exemplary embodiment.

In the etching method according to the exemplary embodiment, the controller 100 opens a non-illustrated opening, and the substrate W having the silicon oxide film 212, the silicon film 213 and the silicon nitride film 214 formed thereon is carried into the plasma processing chamber 11 and placed on the electrostatic chuck 22 of the substrate support 20. As a DC voltage is applied to the electrostatic chuck 22, the substrate W is held on the electrostatic chuck 22. The controller 100 then closes the opening and controls the exhaust system 15, thus allowing the plasma processing space 11$s$ to be evacuated to a preset pressure. Further, the controller 100 controls the non-illustrated temperature control module to adjust the temperature of the substrate W to a predetermined temperature, for example, 30° C. (process S1).

Subsequently, the controller 100 supplies a mixed gas of NF$_3$, SiCl$_4$ and Ar (hereinafter, referred to as NF$_3$/SiCl$_4$/Ar gas) into the gas inlet port 41 as the processing gas. The processing gas is introduced into the plasma processing space 11$s$ of the plasma processing chamber 11 from the gas inlet port 41.

The controller 100 controls the first RF power supply 71 to supply the first RF signal for plasma excitation to the antenna 62. As the first RF signal for plasma excitation is supplied to the antenna 62, plasma is formed in the plasma processing space 11$s$. The silicon film 213 as the etching target film formed on the substrate W is etched by this plasma formed in the plasma processing space 11$s$ (process S2).

To elaborate, the controller 100 etches the silicon film 213 by the plasma formed from the NF$_3$/SiCl$_4$/Ar gas as the processing gas in the plasma processing space 11$s$ in which the NF$_3$/SiCl$_4$/Ar gas is introduced. At this time, to suppress the silicon oxide film 212 as the underlying film from being etched as a result of acceleration of ions and radicals in the plasma, the controller 100 does not apply the second RF signal for bias.

The controller 100 makes a determination upon whether a preset shape is obtained in the etching process (process S3). If it is determined that the preset shape is not obtained (process S3: No), the controller 100 returns the processing to the process S2. Meanwhile, if it is determined that the preset shape is obtained (process S3: Yes), the controller 100 ends the processing. This determination upon whether the preset shape has been obtained may be made based on an etching time.

The controller 100 controls the first RF power supply 71 to stop the supply of the RF signal to the antenna 62, and ends the processing. The controller 100 opens the non-illustrated opening, and the substrate W is carried out of the plasma processing space 11$s$ through the opening.

[Etching Mechanism]

Now, mechanism of the etching by the NF$_3$/SiCl$_4$/Ar gas will be explained. The silicon-containing films such as the silicon oxide film 212, the silicon film 213 and the silicon nitride film 214 formed on the substrate W are etched by the plasma of the halogen-containing gas. For example, when a fluorine (F)-containing gas such as NF$_3$ is used, a Si—Si bond, a Si—O bond or a Si—N bond in the silicon-containing films makes a substitution reaction with a F radical, so that Si is turned into SiF$_4$ to be volatilized. As a result, the etching is accelerated. Since a Si—O bond energy (4.8 eV) and a Si—N bond energy (4.5 eV) are higher than a Si—Si bond energy (2.3 eV), etching rates of the silicon oxide film 212 and the silicon nitride film 214 become lower than an etching rate of the silicon film 213. Thus, etching selectivity for the silicon film 213 against the silicon oxide film 212 and the silicon nitride film 214 can be obtained. However, higher selectivity is required.

In contrast, assume that NF$_3$ is used as the etching gas for the silicon film 213 and SiCl$_4$ is used as the additive gas. In the following description, the silicon oxide film 212 may sometimes be referred to as a SiO$_2$ film; the silicon film 213, a Si film; and the silicon nitride film 214, a SiN film. With regard to the silicon nitride film 214 (SiN film), Si of the SiN film is turned into SiF$_4$ by reacting with F of the NF$_3$ and removed by being volatilized. Meanwhile, since Si is supplied from the SiCl$_4$, this Si reacts with N generated from the SiN film or N remaining on a surface of the SiN film, turning into SiN which is then deposited. This deposited SiN serves as the protective film, so that the etching of the original SiN film is suppressed.

Likewise, as for the silicon oxide film 212 (SiO$_2$ film), Si of the SiO$_2$ film is turned into SiF$_4$ by reacting with F of the NF$_3$ and removed by being volatilized. Meanwhile, since Si is supplied from the SiCl$_4$, this Si reacts with O generated from the SiO$_2$ film or O remaining on a surface of SiO$_2$ film, turning into SiO$_2$ which is then deposited. This deposited SiO$_2$ serves as the protective film, so that the etching of the original SiO$_2$ film is suppressed.

Meanwhile, with regard to the silicon film 213 (Si film), Si of the Si film is turned into SiF$_4$ by reacting with F of the NF$_3$ and removed by being volatilized. Further, since neither N nor O remains on a surface of the Si film, the protective film which becomes a hindrance to the etching is not formed even if Si is supplied from the SiCl$_4$. Further, since Cl, which is a halogen, is supplied from the SiCl$_4$, the Si is turned into SiCl$_4$ and removed by being volatilized, and the etching of the Si film is accelerated. Accordingly, the etching rate of the silicon film 213 is increased while the etching of the silicon oxide film 212 and the etching of the silicon nitride film 214 is suppressed. Thus, the etching selectivity for the silicon film 213 against the silicon oxide film 212 and the silicon nitride film 214 is improved.

Further, although the SiCl$_4$ is used as the additive gas (silicon-containing gas) in the aforementioned example, any of various other gases may be used as long as the gas is a compound having silicon (Si) and one or more of halogens and hydrogen. Further, although the NF$_3$ is used as the halogen-containing gas, any of various other gases may be used as long as the gas includes a halogen which reacts with Si to be volatilized. If, however, a fluorocarbon gas is used, a CF-based deposit is generated, which raises a concern that the etching rate of the Si film may be reduced. Further, since N of the SiN film and O of the SiO$_2$ film react with C of the fluorocarbon gas and are turned into CN and CO to be volatilized, the etching of the SiN film and the SiO$_2$ film may be accelerated. Likewise, if TEOS (Tetra Ethyl Ortho Silicate) or an aminosilane-based gas is used as the silicon-containing gas, the etching of the SiN film and the etching of the SiO$_2$ film may be accelerated as these gases include carbon (C). Thus, it is desirable that the halogen-containing gas and the silicon-containing gas do not include the carbon (C).

Now, assume that an O$_2$ gas is included in the processing gas. In this case, since O exists in the plasma, the O is supplied to all of the SiN film, the SiO$_2$ film and the Si film. Accordingly, the O reacts with Si of these films, forming the protective film (etching hindering film) for all of these films. Further, since the O$_2$ gas reacts with the silicon-containing gas (for example, SiCl$_4$), a deposit (for example, SiClO) is generated and deposited on the SiN film, the SiO$_2$ film and the Si film. Accordingly, even if the etching of the SiN film and the etching of the SiO$_2$ film can be suppressed, the etching rate of the Si film is reduced. In view of this, in the present exemplary embodiment, only the SiCl$_4$ gas is introduced as the deposition gas without introducing the O$_2$ gas. Accordingly, the protective film for the SiN film by only N from the SiN film and the protective film for the SiO$_2$ film by only O from the SiO$_2$ film can be formed on the SiN film and the SiO$_2$ film, respectively. Further, the protective film is difficult to form on the Si film. Further, since an oxygen-containing part such as quartz exists within the plasma processing chamber 11, O$_2$ may be supplied from this part even if the O$_2$ gas is not added to the processing gas. In view of this, in the present exemplary embodiment, Ar is supplied as the dilution gas at a flow rate several tens of times as large as the flow rates of the halogen-containing gas and the silicon-containing gas. That is, it is desirable that the flow rate of the Ar gas as the dilution gas is set to be equal to or larger than 70% of a total flow rate of the mixed gas as the processing gas, more desirably, equal to or larger than 90%.

By setting the flow rate of the Ar gas to be in this range, a partial pressure of the O$_2$ originated from the part within the plasma processing chamber 11 is reduced, and the formation of the O-containing protective film on the Si film can be suppressed.

[Experimental Results]

Now, referring to FIG. 4, experimental results will be described. FIG. 4 is a diagram illustrating an example of experimental results. FIG. 4 shows experimental results of an experimental example according to the present exemplary embodiment, a comparative example 1 and a comparative example 2. The comparative example 1 shows a case where the SiCl$_4$ gas is not supplied, and the comparative example 2 shows a case where the O$_2$ gas is supplied. In each experiment, the etching is performed under the following processing conditions after performing a breakthrough processing on the substrate W. Further, in FIG. 4, Poly denotes a silicon film; Ox, a silicon oxide film; and SiN, a silicon nitride film. Furthermore, in FIG. 4, EA denotes an etching amount; A, a unit of the etching amount; Poly/Ox, selectivity between the silicon film and the silicon oxide film; Poly/SiN, selectivity between the silicon film and the silicon nitride film. Additionally, in the processing conditions specified as follows, 'CW' of a power of the RF signal represents a continuous wave.

<Processing Conditions>

Pressure within plasma processing chamber 11: 300 mTorr (40.0 Pa)

Power of first RF signal (27 MHz): 500 W (CW)

Power of second RF signal (13 MHz): 0 W (CW)

Processing time: 60 sec

Temperature: 30° C.

Processing Gas:

(Experimental example) NF$_3$/SiCl$_4$/Ar=15/5/1200 sccm (Comparative example 1) NF$_3$/SiCl$_4$/Ar=15/0/1200 sccm (Comparative example 2) NF$_3$/O$_2$/SiCl$_4$/Ar=15/5/22/1200 sccm As shown in FIG. 4, in the experimental example, an etching amount of the silicon film is found to be 1676.3 Å; an etching amount of the silicon oxide film, −43.6 Å; an etching amount of the silicon nitride film, −20.9 Å. Minus value of the etching amounts of the silicon oxide film and the silicon nitride film indicates that a deposit is formed. Selectivity between the silicon film and the silicon oxide film and selectivity between the silicon film and the silicon nitride film are found to be infinite (∞). Further, in the experimental example, a flow rate of the Ar amounts to 98.4% of a total flow rate of the processing gas.

In the comparative example 1, the etching amount of the silicon film is found to be 193.1 Å; the etching amount of the silicon oxide film, −9.9 Å; the etching amount of the silicon nitride film, −0.6 Å. The selectivity between the silicon film and the silicon oxide film and the selectivity between the silicon film and the silicon nitride film are found to be infinite (∞), the same as in the experimental example. Comparison of the experimental example and the comparative example 1, however, reveals that the etching amount of the silicon film is increased greatly by supplying the SiCl$_4$ gas.

In the comparative example 2, the etching amount of the silicon film is found to be −20.7 Å; the etching amount of the silicon oxide film, −33.8 Å; the etching amount of the silicon nitride film, −8.6 Å. That is, the etching of the silicon film does not progress. Further, the selectivity between the silicon film and the silicon oxide film is found to be 0.6, and the selectivity between the silicon film and the silicon nitride film is found to be 2.4. Accordingly, it is found out from the experimental results of the experimental example, the comparative example 1 and the comparative example 2 that the silicon film can be etched at a high etching rate with high selectivity by using the processing gas including the $SiCl_4$ gas but not including the $O_2$ gas.

Modification Examples

Although the above exemplary embodiment has been described for the example where the silicon film is etched when the substrate W has both the silicon oxide film and the silicon nitride film as well as the silicon film, the exemplary embodiment is not limited thereto. By way of example, even in case of etching the silicon film when the substrate W has the silicon film and only either one of the silicon oxide film and the silicon nitride film, it is still possible to etch the silicon film at a high etching rate with high selectivity. Likewise, even in case of etching the silicon film when the substrate W has a SiON film as a mixed compound of $SiO_2$ and SiN and a $SiOCH_3$ (Low-k) film as well as the silicon film, it is still possible to etch the silicon film at a high etching rate with high selectivity. In addition, as for a silicon carbide film (SiC film), since C is left after Si is volatilized by reacting with halogen, a protective film of SiC is formed by a reaction between Si from the silicon-containing gas and the residual C, the same as in the case of the silicon oxide film and the silicon nitride film. Thus, in case of etching the silicon film when the substrate W has the silicon carbide film as well as the silicon film, it is still possible to etch the silicon film at a high etching rate with high selectivity.

Further, in the above-described exemplary embodiment, the $NF_3/SiCl_4/Ar$ gas is used as the mixed gas serving as the processing gas. However, as mentioned above, various other kinds of gases may be used as the halogen-containing gas and the silicon-containing gas. It is desirable that the mixed gas is composed of, among combinations of these gases, $NF_3$ or $SF_6$; $SiCl_4$ or $SiF_4$; and Ar only.

Additionally, in the above-described exemplary embodiment, the film which is composed of only the silicon (Si) such as the polysilicon, the amorphous silicon or the single crystalline silicon is mentioned as the silicon film. However, the silicon film may include a small quantity of boron (B), phosphorous (P) or arsenic (As) doped therein.

According to the present exemplary embodiment described so far, the controller 100 of the plasma processing system 1 performs the process of providing the substrate W having the first film (silicon film 213) made of the silicon only and the second film (silicon nitride film 214) including the silicon, and the process of etching the first film by the plasma formed from the mixed gas including the halogen-containing gas and the silicon-containing gas but not including the oxygen-containing gas. As a result, the silicon can be etched at a high etching rate with high selectivity.

Further, according to the present exemplary embodiment, the second film includes one or more of oxygen, nitrogen and carbon. As a result, etching of the second film can be suppressed.

Furthermore, according to the present exemplary embodiment, the second film is $SiO_2$, SiN, SiC, SiON, or $SiOCH_3$. Thus, etching of the second film can be suppressed.

Moreover, according to the present exemplary embodiment, the first film is polysilicon, amorphous silicon or single crystalline silicon. Thus, the silicon can be etched at a high etching rate.

Also, according to the present exemplary embodiment, the substrate W further includes the third film (silicon oxide film 212) including silicon. This third film can stop the etching of the silicon.

Further, according to the present exemplary embodiment, the first film and the second film are formed on the third film, and the top surfaces of the first film and the second film are higher than the top surface of the third film. The second film is formed to be in contact with the side surface of the first film, and the first to third films are exposed to the plasma processing space 11s. Thus, a fin-shaped film can be formed on the substrate W.

Also, according to the present exemplary embodiment, the third film and the second film have different compositions.

Furthermore, according to the present exemplary embodiment, the third film is $SiO_2$, SiN, SiC, SiON, or $SiOCH_3$. Thus, the etching of the silicon can be stopped by the third film.

Moreover, according to the present exemplary embodiment, the second film is SiN, and the third film is $SiO_2$.

In addition, according to the present exemplary embodiment, the halogen of the halogen-containing gas includes one or more of fluorine, chlorine, bromine, and iodine. As a result, the silicon can be etched at a high etching rate with high selectivity.

Further, according to the present exemplary embodiment, the halogen-containing gas does not include carbon. Accordingly, the silicon can be etched at a high etching rate with high selectivity.

Furthermore, according to the present exemplary embodiment, the halogen-containing gas includes one or more of $NF_3$, $SF_6$, $Cl_2$, HCl, $BCl_3$, HBr, $Br_2$ and HI. As a result, the silicon can be etched at a high etching rate with high selectivity.

Additionally, according to the present exemplary embodiment, the silicon-containing gas includes one or more of $SiCl_4$, $SiF_4$, $SiH_4$ and $SiH_2Cl_2$. As a result, the silicon can be etched at a high etching rate with high selectivity.

Moreover, according to the present exemplary embodiment, the mixed gas further includes the dilution gas, and the flow rate of the dilution gas is equal to or larger than 70% of the total flow rate of the mixed gas. As a result, an influence of the oxygen supplied from the part within the plasma processing chamber 11 can be suppressed.

Further, according to the exemplary embodiment, the dilution gas is the rare gas. As a result, an influence of the oxygen supplied from the part within the plasma processing chamber 11 can be suppressed.

Furthermore, according to the exemplary embodiment, the mixed gas is composed of $NF_3$ or $SF_6$; $SiCl_4$ or $SiF_4$; and Ar only. As a result, the silicon can be etched at a high etching rate with high selectivity.

In addition, according to the present exemplary embodiment, in the etching process, a RF bias power is not applied. Thus, etching of the third film can be suppressed.

It should be noted that the above-described exemplary embodiment is illustrative in all aspects and is not anyway limiting. The above-described exemplary embodiment may be omitted, replaced and modified in various ways without departing from the scope and the spirit of claims.

Further, though the above exemplary embodiment has been described for the plasma processing apparatus 10 configured to perform a processing such as the etching on the substrate W by using the inductively coupled plasma as a plasma source, the present disclosure is not limited thereto. The plasma source is not limited to the inductively coupled plasma as long as the plasma processing apparatus is configured to perform a processing on the substrate W by using plasma. By way of non-limiting example, any of various kinds of plasma sources such as capacitively coupled plasma, microwave plasma and magnetron plasma may be used.

According to the exemplary embodiment, it is possible to etch the silicon at a high etching rate with high selectivity.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method performed in a substrate processing apparatus, comprising:
    providing a substrate which has a Si film, a SiN film and a $SiO_2$ film; and
    etching the Si film by plasma formed from a mixed gas composed of a halogen-containing gas, a silicon-containing gas and a rare gas,
    wherein the mixed gas does not include carbon,
    the Si film and the SiN film are formed on the $SiO_2$ film,
    top surfaces of the Si film and the SiN film are higher than a top surface of the $SiO_2$ film, and
    the SiN film is formed to be in contact with a side surface of the Si film, and the Si film, the SiN film and the $SiO_2$ film are exposed to a plasma processing space.

2. A substrate processing method performed in a substrate processing apparatus, comprising:
    providing a substrate which has a first film composed of silicon only and a second film including silicon; and
    etching the first film by plasma formed from a mixed gas including a halogen-containing gas and a silicon-containing gas but not including an oxygen-containing gas.

3. The substrate processing method of claim 2, wherein the second film includes one or more of oxygen, nitrogen and carbon.

4. The substrate processing method of claim 3, wherein the second film is $SiO_2$, SiN, SiC, SiON, or $SiOCH_3$.

5. The substrate processing method of claim 2, wherein the first film is polysilicon, amorphous silicon or single crystalline silicon.

6. The substrate processing method of claim 2, wherein the substrate further has a third film including silicon.

7. The substrate processing method of claim 6, wherein the first film and the second film are formed on the third film,
    top surfaces of the first film and the second film are higher than a top surface of the third film, and
    the second film is formed to be in contact with a side surface of the first film, and the first film to the third film are exposed to a plasma processing space.

8. The substrate processing method of claim 7, wherein the third film and the second film have different compositions.

9. The substrate processing method of claim 7, wherein the third film is $SiO_2$, SiN, SiC, SiON, or $SiOCH_3$.

10. The substrate processing method of claim 7, wherein the second film is SiN, and the third film is $SiO_2$.

11. The substrate processing method of claim 2, wherein a halogen of the halogen-containing gas includes one or more of fluorine, chlorine, bromine, and iodine.

12. The substrate processing method of claim 11, wherein the halogen-containing gas does not include carbon.

13. The substrate processing method of claim 11, wherein the halogen-containing gas includes one or more of $NF_3$, $SF_6$, $Cl_2$, HCl, $BCl_3$, HBr, $Br_2$ and HI.

14. The substrate processing method of claim 2, wherein the silicon-containing gas includes one or more of $SiCl_4$, $SiF_4$, $SiH_4$ and $SiH_2Cl_2$.

15. The substrate processing method of claim 2, wherein the mixed gas further includes a dilution gas, and a flow rate of the dilution gas is equal to or larger than 70% of a total flow rate of the mixed gas.

16. The substrate processing method of claim 15, wherein the dilution gas is a rare gas.

17. The substrate processing method of claim 16, wherein the mixed gas is composed of $NF_3$ or $SF_6$; $SiCl_4$ or $SiF_4$; and Ar only.

18. The substrate processing method of claim 2, wherein in the etching of the first film, a RF bias power is not applied.

* * * * *